(12) United States Patent
Tsai et al.

(10) Patent No.: US 8,279,653 B2
(45) Date of Patent: Oct. 2, 2012

(54) MAGNETIC SHIFT REGISTER MEMORY IN STACK STRUCTURE

(75) Inventors: Ching-Hsiang Tsai, Kaohsiung (TW); Chien-Chung Hung, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 369 days.

(21) Appl. No.: 12/565,779

(22) Filed: Sep. 24, 2009

(65) Prior Publication Data

US 2010/0328986 A1    Dec. 30, 2010

(30) Foreign Application Priority Data

Jun. 29, 2009   (TW) .............................. 98121866 A (51) Int. Cl.
*G11C 19/00*   (2006.01)
(52) U.S. Cl. ...... 365/80; 365/51; 365/171; 365/189.011
(58) Field of Classification Search .................... 365/51, 365/80, 81, 171, 130, 158, 189.011
See application file for complete search history.

(56) References Cited

U.S. PATENT DOCUMENTS

| | | |
|---|---|---|
| 2,919,432 A * | 12/1959 | Broadbent ...................... 365/85 |
| 6,834,005 B1 | 12/2004 | Parkin |
| 6,898,132 B2 | 5/2005 | Parkin |
| 7,031,178 B2 * | 4/2006 | Parkin ............................. 365/80 |
| 7,236,386 B2 | 6/2007 | Parkin |
| 7,710,757 B2 * | 5/2010 | Kim et al. ....................... 365/81 |
| 2008/0080234 A1 * | 4/2008 | Iwata et al. .................... 365/171 |
| 2009/0040883 A1 | 2/2009 | Kim et al. |

* cited by examiner

*Primary Examiner* — Pho M Luu
*Assistant Examiner* — Thao Bui
(74) *Attorney, Agent, or Firm* — Jianq Chyun IP Office (57) ABSTRACT

A magnetic shift register memory in stack structure includes magnetic shift registering layers for forming an unit of stack structure. Each registering layer has multiple magnetic domains and each domain has a magnetization direction corresponding to a stored data. The two adjacent magnetic shift registering layers respectively have an upper magnetic domain and a lower magnetic domain forming a coupling region. By a coupling structure, the lower magnetic domain and the upper magnetic domain have the same stored data. A driving current unit is coupled to the magnetic shift registering layers for respectively providing a driving current in a predetermined direction to the magnetic shift registering layers. As a result, the stored data in the magnetic domains of the magnetic shift registering layers is shifted in a direction from a foremost registering layer to a last registering layer of the magnetic shift registering layers via the coupling structure.

19 Claims, 13 Drawing Sheets

MAGNETIC SHIFT REGISTER MEMORY IN STACK STRUCTURE

CROSS-REFERENCE TO RELATED APPLICATION

This application claims the priority benefit of Taiwan application serial no. 98121866, filed on Jun. 29, 2009. The entirety of the above-mentioned patent application is hereby incorporated by reference herein and made a part of specification.

BACKGROUND

1. Technical Field

The disclosure relates to a magnetic shift register memory and the operation thereof.

2. Technical Art

Magnetoresistive Random Access Memory (MRAM) has advantages of non-volatility, high density, fast read/write speed, radiation resistance, and so on. Such features make the MRAM a potential candidate to replace the conventional semiconductor memory and to provide embedded memory applications. A conventional magnetic writing MRAM device uses metal lines for current conduction, sensing the magnetic field, and switching the free layer of the MRAM. With to size reductions come a significant increase in demagnetization effects and the write current requirement. Therefore, this type of MRAMs suffers from various difficulties in scalibility. Spin-torque transfer switching (STT), also known as Spin-RAM, is a next generational writing magnetic memory technique proposed in the recent years. Since the write current directly flows to the memory element, with the size of memory decreasing, the write current requirement also accordingly decreases. Hence, this type of memory features ease of scaling. However, the STT technique has questionable device thermal stability, an overly large write current requirement, as well as reliability concerns. These factors hamper the mass production potential of this type of memory.

Other conventional techniques also use current pulses to induce current-driven domain wall motion, and these techniques were proposed and developed between 1998 and 2004. U.S. Pat. No. 6,834,005 B1 has proposed the magnetic shift register memory, a device structure capable of drastic increase in chip or hard drive data storage volume. This type of memory has the possibility of replacing the DRAM, the SRAM, the FLASH memory, and may even make "disk drive on a chip" to be possible. This type of memory has magnetic disks similar to ones in hard drives, but folded into a 3D stacking structure for storage. Current-driven domain wall motion is used to record data sequentially into the disks, and operational speed exceeds the FLASH chip and the hard drive.

Figures 1A, 1B, 1C:
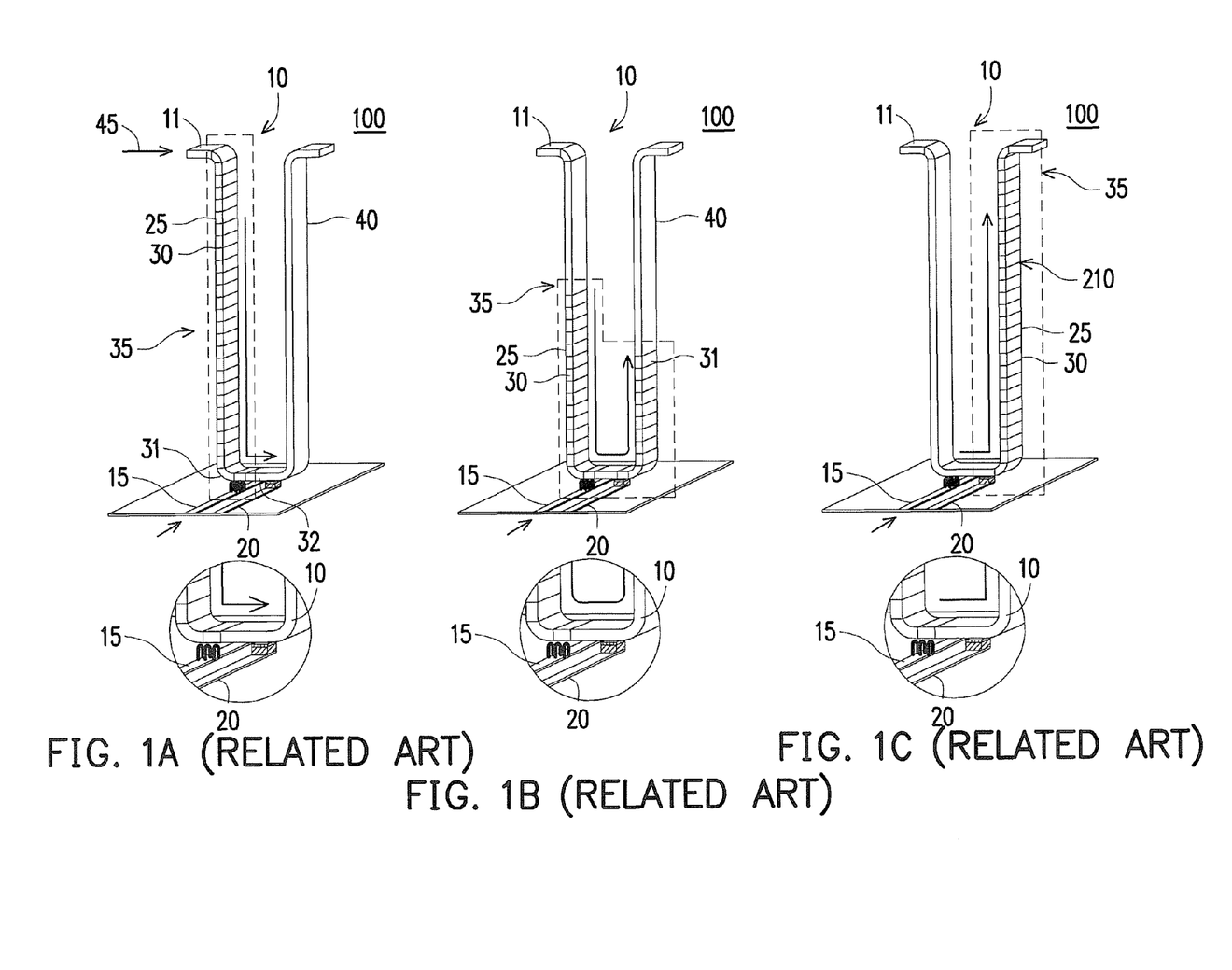
FIGS. 1A-1C represent schematic diagrams illustrating the operation of a conventional magnetic shift register memory

FIGS. 1A-1C represent schematic diagrams illustrating the operation of a conventional magnetic shift register memory. A memory device 100 includes a storage region 35, a reservoir region 40, a writing device 15, and a reading device 20. The memory device 100 can be a shift register memory comprising of magnetic metallic materials such as the NiFe, CoFe, or similar ferromagnetic materials that can provide data storage and a track 11 for motion. A plurality of small magnetic domains 25 and 30 can be magnetized on track 11. The magnetization directions of the magnetic domains can represent the logic 0 or 1 value of the storage data. Track 11 of the magnetic shift register memory is serially coupled with a neighboring track. A set of writing device 15 and reading device 20 form a set of memory region. Each memory region includes the storage region 35 and the reservoir region 40. While data storing is at the quiescent state, or a stable state not having current-driven domain wall motion, a plurality of memory units such as the magnetic domain 25 representing data 0 and the magnetic domain 30 representing data 1 are sequentially stored in the storage region 35. The reservoir region 40 does not have data stored at this time. The reading device 20 of the magnetic shift register memory is coupled to the track 11 by a magnetic tunneling junction (MTJ). Data bits are sequentially read by passing through current pulses 45, where each of the magnetic domains 25 and 30 has domain wall motion (DWM) towards the direction of electron flow.

FIG. 1B illustrates a pause status, in which a nearest data bit of the reading device 20 can be read, the previously read data bit is moved into the reservoir region 40 until all the data bit stored in the storage region 35 have been read, then all the data bits are moved into the reservoir region 40, and thereafter using current pulses 45 of a reverse direction to move all the data bits back to the storage region 35. When the magnetic shift register memory is writing data, or passing through current pulses 45 to move the magnetic domain for data writing to the writing device 15. At this time, another writing line employing domain wall motion moves a stray field having a predetermined direction into the writing region, thereby causing the magnetic domain to spin to the desired direction for data writing, and thereafter the data in the magnetic domain is sequentially moved back to their original position by current pulses 45 having a reverse direction. According to common knowledge for a memory, the reading device 20 uses a select transistor (e.g. a MOS transistor) coupled to a sense amplifier. The select transistor occupies the surface area of the Si substrate, and the size of data magnetic domains 25 and 30 is usually much smaller than the select transistor. Therefore, the effective size of the magnetic shift register memory is determined by the occupied area of the select transistor, as well as a set of transistors for controlling the data bits (magnetic domains 25 and 30) stored in the storage region 35. Since the magnetic shift register memory includes a plurality of bits, the effective bit size can be decreased.

Figure 2:
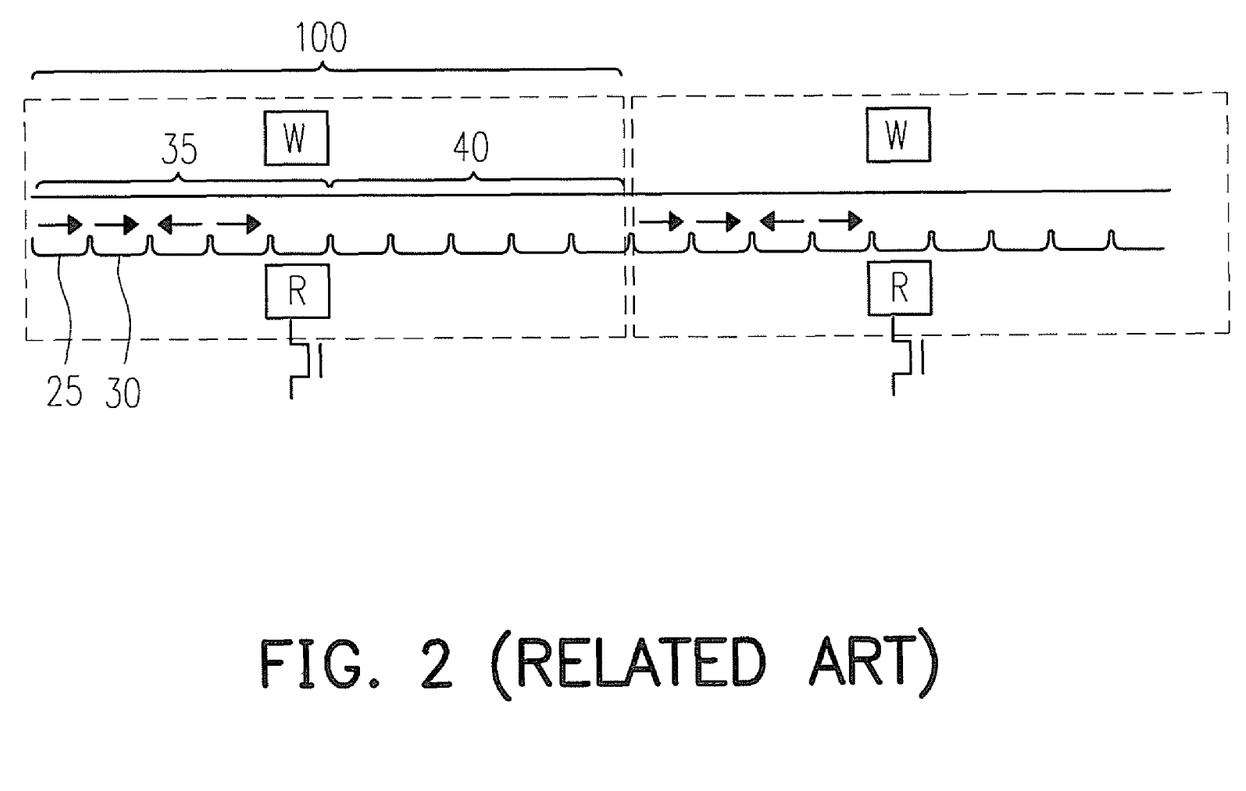
FIG. 2 represents a schematic diagram illustrating a plurality of mechanisms depicted in FIGS. 1A-1C.
Figure 3:
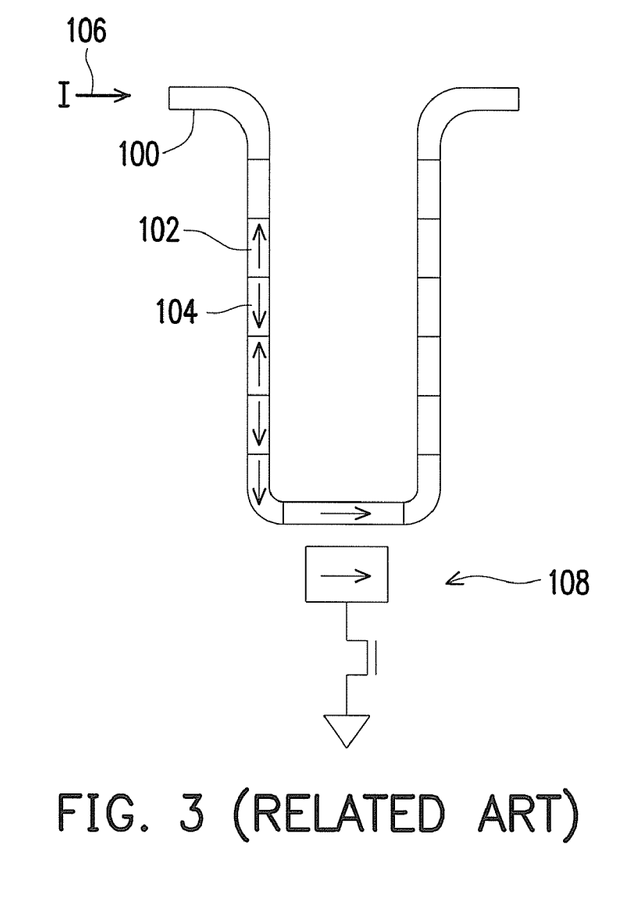
FIG. 3 represents a schematic diagram illustrating a read mechanism.

FIG. 2 represents a schematic diagram illustrating a plurality of mechanisms depicted in FIGS. 1A-1C. Referring to FIG. 2 and simplifying the mechanism of FIG. 1, the magnetic shift register memory 100 is expanded on a linear track, in which the magnetic shift register memory 100 includes the storage region 35 and the reservoir region 40, each having a plurality of magnetic domains 25 and 30. As shown in FIG. 2, the storage region 35 of the magnetic shift register memory 100 records 4 bits of data that, can be moved into the reservoir region 40. FIG. 3 represents a schematic diagram illustrating a read mechanism. Referring to FIG. 3, an example of the reading mechanism can be applying a current pulse 106 to the magnetic shift register memory 100. The magnetic domains 102 and 104 are moved, and one of the magnetic domains 102 and 104 reads the data bits of the circuit 108 by reading the position thereof. On the other hand, data can be written into the magnetic domain by using a write circuit for writing in the data.

However, the conventional magnetic shift register memory design is still not optimal. The techniques for the magnetic shift register memory are in their early developmental phase, with manufacturers earnestly devoting research and development efforts.

In the above-described conventional designs, the magnetization direction of the magnetic domain is parallel to the magnetic track, thereby needing a larger width and thus increasing the size of the magnetic domains of the memory cells. There are conventional techniques proposing designs having the magnetization direction on the magnetic domain perpendicular to the magnetic track, thereby decreasing the size of the memory cell. However, such a perpendicular memory cell cannot move effectively on an U-shaped magnetic track. Therefore, the U-shaped magnetic track design is in need of improvements.

SUMMARY

An embodiment provide a magnetic shift register memory in stack structure comprising a plurality of magnetic shift registering layers forming an unit of stacking structure. Each of the magnetic shift registering layers has a plurality of magnetic domains, and each of the magnetic domains has a magnetization direction corresponding to a stored data. An upper magnetic domain and a lower magnetic domain are respectively disposed between two adjacent magnetic shift registering layers forming a coupling region. A coupling structure is adapted so that the lower magnetic domain and the upper magnetic domain have the same stored data. A driving current unit is coupled to the magnetic shift registering layers for respectively providing a driving current of a predetermined direction thereto, thereby allowing the stored data of the magnetic shift registering layers to flow, sequentially and in a direction of motion, from a foremost registering layer to a last registering layer via the coupling structure.

In one embodiment, the magnetic shift register memory in stack structure further includes a writing device and a reading device. The writing device is disposed in either the foremost registering layer or the last registering layer for writing a written data into one of the magnetic domains passing before the writing device. The reading device is disposed in either the foremost registering layer or the last registering layer for reading a read data from one of the magnetic domains passing before the reading device.

In one embodiment, the magnetic shift register memory in stack structure further comprises a circuit unit for transmitting the read data to the writing device for use as the written data for a repeated writing into the magnetic domain passing before the writing device.

BRIEF DESCRIPTION OF THE DRAWINGS

The accompanying drawings are included to provide a further understanding of the embodiment, and are incorporated in and constitute a part of this specification. The drawings illustrate embodiments and, together with the description, serve to explain the principles of the embodiment.

DESCRIPTION OF EMBODIMENTS

An embodiment provide a structure and an operation method of a magnetic shift register memory having high bit density. The magnetic shift register memory is arranged in a stacking structure of a plurality of film layers adapted to a plurality of bit coupling regions for transmitting bit information between the film layers. A dual current source driving scheme can be used, in which the bit information stored in the layers can be transmitted between each layer via the bit coupling regions, thereby connecting devices of large size for driving the entire domain wall motion is unnecessary. In this stacking structure, the film layers can be electrically insulated from each other, although the bit coupling regions are communication bridges allowing signal transmittance between each of the film layers. Formation of the bit coupling regions can be determined by their material characteristics. Using the perpendicular magnetic materials as an example, the coercive force of the material for each of the film layers is controlled so that a bit combination having unequal coercive force is formed on a bit coupling region. An one-way coupling mechanism is formed by inducing a fringing field in a perpendicular direction for writing a particular bit. On the other hand, parallel materials can use the cross-coupling force between the magnetic films to complete the data transmitting mechanism. With coupling regions designed to send bit information one-way, bit data between the stacked films can be effectively and orderly transmitted.

The stacked magnetic films according to embodiments can drastically increase bit density of the device. A plurality of magnetic tracks are arranged in parallel to avoid the deep trench processes needed for fabricating an U-shaped track. Since domain wall motion is extremely sensitive to shape variation of the track, arranging the stacked magnetic tracks in parallel can lower the difficulties of domain wall motion caused by the U-shaped track.

A perpendicular material can have a multi-film deposition structure, such as Co/Ni and the like, and such materials cannot be used in the fabrication of U-shaped tracks. Therefore, horizontal deposition on the side-wall track is necessary. However, both horizontal and perpendicular materials are compatible with the stacked magnetic tracks described in embodiments. The magnetic shift register memory in stack structure described in embodiments has high bit density, high compatibility, and can be planar fabricated. Additionally, having tracks arranged in plane provides better tracks for domain wall motion and improves the reliability of reading and writing a bit.

The following will describe some embodiments as examples, however the application is not limited by the embodiments. The embodiments described below can be combined with each other.

Figure 4:
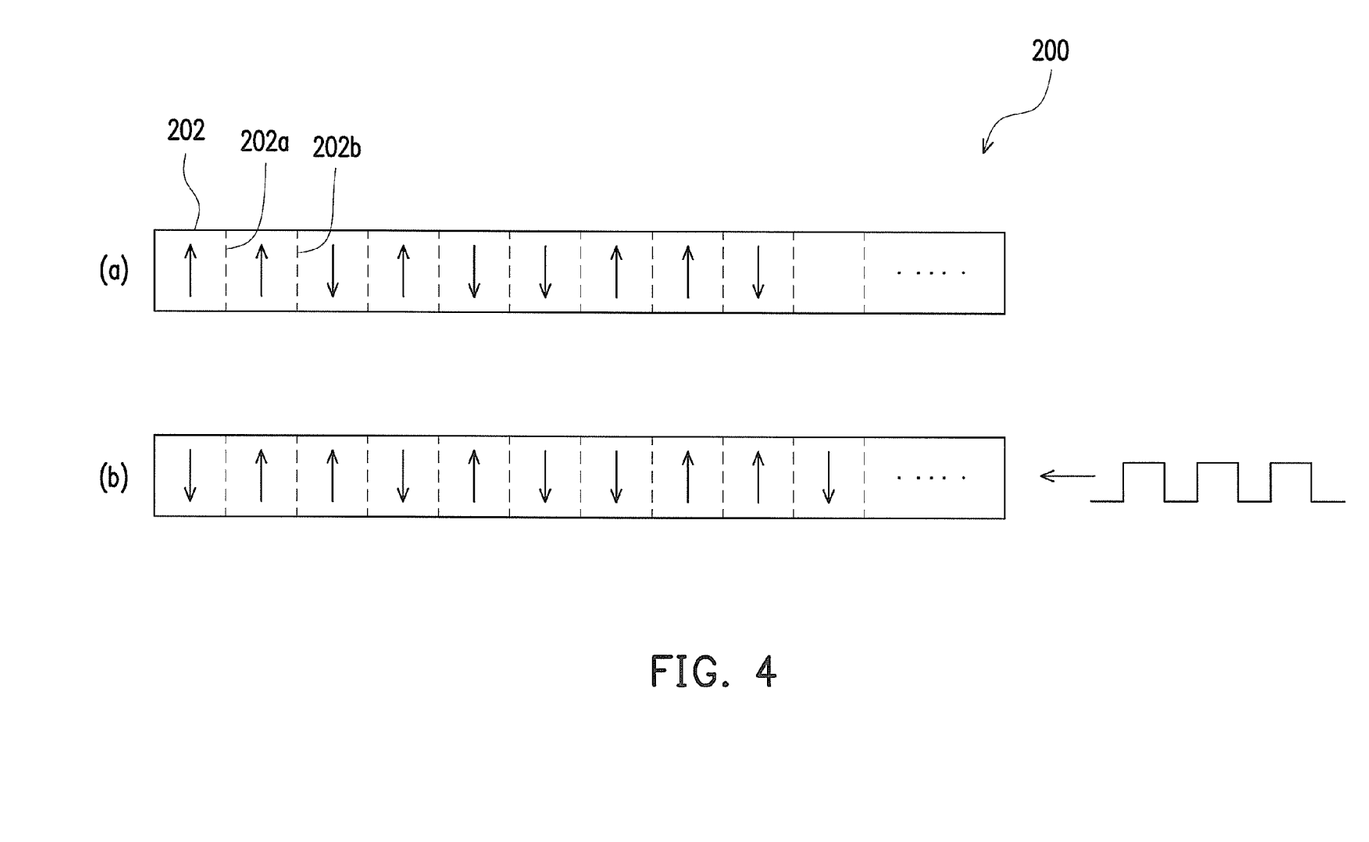
FIG. 4 represents a cross-sectional schematic diagram illustrating a magnetic shift registering layer comprised of perpendicular materials in accordance with one embodiment.

FIG. 4 represents a cross-sectional schematic diagram illustrating a magnetic shift registering layer comprised of perpendicular materials in accordance with one embodiment. Referring to FIG. 4(a), a magnetic shift registering layer 200 has a structure of a plurality of tracks of film layers. A plurality of magnetic domains 202 are foamed on the magnetic shift registering layer 200. For perpendicular magnetic materials, each of the magnetic domains has a magnetization direction perpendicular to the magnetic shift registering layers. As shown by the arrow symbols, an up direction or a down direction can each respectively correspond to a bit storing a data of a "0" or a "1". A boundary such as 202a or 202b is formed between adjacent magnetic domains. A domain wall is generated when adjacent magnetic domains have different magnetization directions. Referring to FIG. 4(b), domain wall motion corresponds to electron flow, and the domain wall motion moves in a direction opposite to the direction of the positive current. When pulses of a driving current are inputted from the right, during each pulse the stored data in the magnetic domains move one magnetic domain to the right. Depending on operational needs, new storage data can be written into the leftmost magnetic domain.

Figure 5:
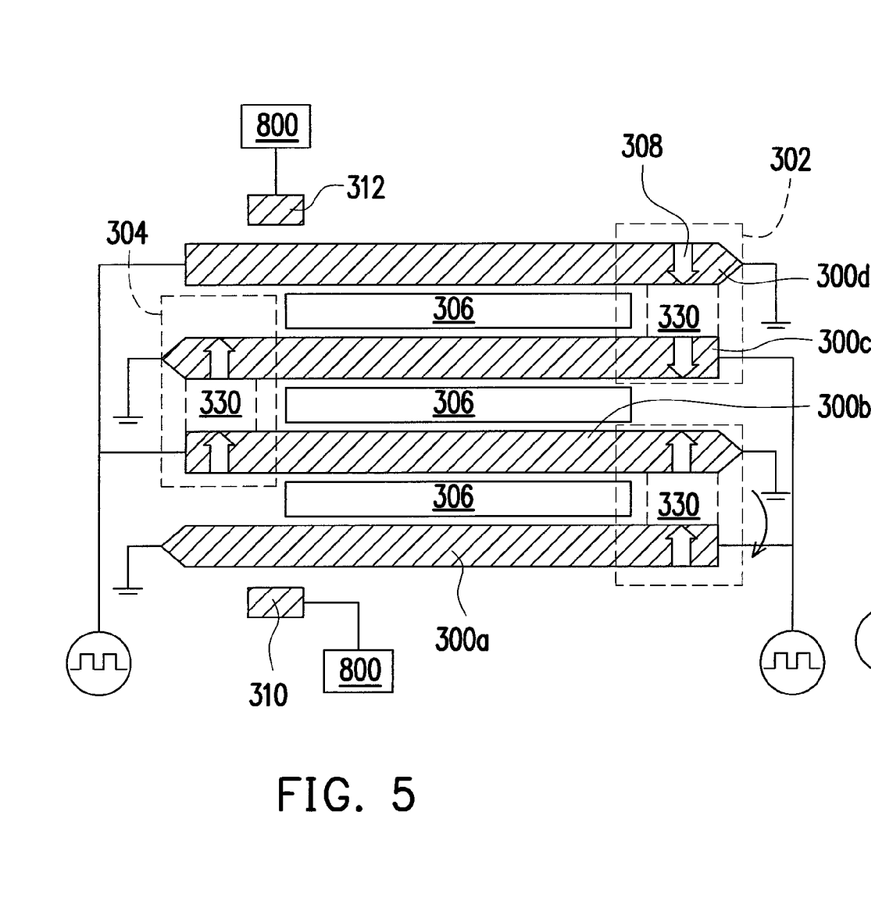
FIG. 5 represents a cross-sectional schematic diagram illustrating a magnetic shift register memory in stack structure in accordance with one embodiment.

FIG. 5 represents a cross-sectional schematic diagram illustrating the magnetic shift register memory in stack structure in accordance with one embodiment. Referring to FIG. 5, a unit of the magnetic shift register memory in stack structure includes a plurality of magnetic shift registering layers 300a, 300b, 300c, and 300d forming an unit of stack structure. The embodiment uses four layers as an example, but real layer numbers are determined in accordance with different designs. As shown in FIG. 4, each of the magnetic shift registering layers 300a-300d has a plurality of magnetic domains, and each of the magnetic domains has a magnetization direction corresponding to a stored data. The embodiment uses perpendicular materials as an example, hence the magnetization direction is perpendicular to the magnetic shift registering layers, such as for a structure of a nanowire layer. An upper magnetic domain and a lower magnetic domain are respectively disposed between two adjacent magnetic shift registering layers (e.g., between shift registering layers 300c and 300d) forming a coupling region 302. A coupling structure 330 is adapted so that the lower magnetic domain and the upper magnetic domain have the same stored data, as indicated by a magnetization direction 308. Each of the upper magnetic domain and the lower magnetic domain is respectively disposed on a side of the magnetic shift registering layers 300d and 300c, and the upper magnetic domain and the lower magnetic domain have an upper and lower positional relationship, respectively.

The coupling structure 330 can comprise of a magnetic coupling material or free space. Using perpendicular materials as example, if data is designed to be transferred downwards, then a fringing field of the upper magnetic domain of the coupling region 302 disposed on the magnetic shift registering layer 300d induces the lower magnetic domain of the coupling region 302 disposed on the magnetic shift registering layer 300c, so that the upper and lower magnetic domains of the coupling region 302 have the same downward magnetization direction 308. A coupling region 304 at the other end of the two magnetic shift registering layers 300c and 300b uses the same mechanism for transmitting data. A coupling region at the other end of the two magnetic shift registering layers 300a and 300b also uses the same mechanism for transmitting data, so no further description is provided herein.

Additionally, a shielding layer 306 is provided to prevent neighboring memory layers from mutually interfering other magnetic domains. Using the magnetic shift registering layer 300d for example, one end of a magnetic shift registering layer 300d is driven in a predetermined direction by a driving current unit, while the other end is connected to ground. Moreover, the magnetic domain on the grounded end can have a sharp protrusion structure. When data is moved out of the grounded magnetic domain, the sharp protrusion structure helps to clear the data but does not affect new data moved into the magnetic domain. In the embodiment, data of the odd-numbered magnetic shift registering layers 300a and 300c is moving from right to left, and data of the even-numbered magnetic shift registering layers 300b and 300d is moving from left to right.

In operations, a writing device 312 can be disposed in the uppermost magnetic shift registering layer 300d, and a reading device 310 can in disposed on the lowermost magnetic shift registering layer 300a. A circuit unit 800 can transmit the data read by the reading device 310 back to the writing device 312 for writing into a corresponding magnetic domain. For a data writing operation, the writing device 312 directly writes the newly inputted data without the reading device 310 reading the old data.

Figure 6:
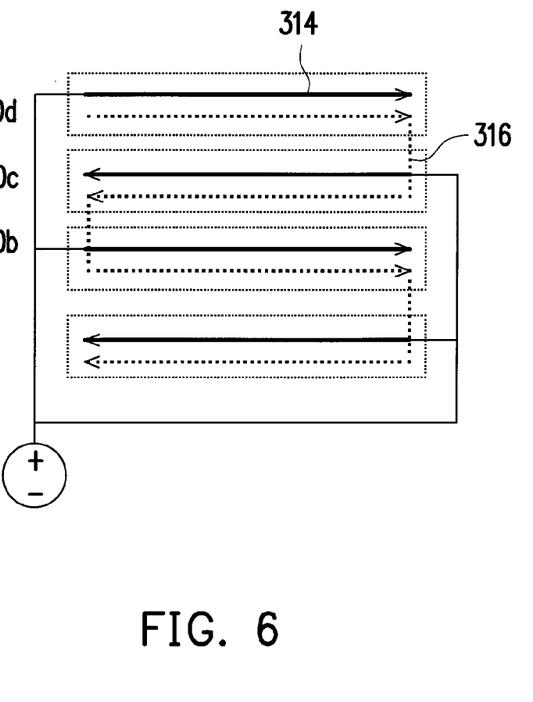
FIG. 6 represents a schematic diagram illustrating a flow direction for the magnetic domains and a current flow direction based on the structure depicted in FIG. 5 in accordance with one embodiment.

In order to achieve a similar effect of an elevator moving downwards in a multi-level building, the embodiment designs, for example, different flow directions for the two adjacent magnetic shift registering layers, thereby data can successfully move from the uppermost magnetic shift registering layer 300d to the bottommost magnetic shift registering layer 300a. FIG. 6 represents a schematic diagram illustrating a flow direction for the magnetic domains and a current flow direction based on the structure depicted in FIG. 5 in accordance with one embodiment. Referring to FIG. 6, a dotted line 316 depicts a path of motion for the magnetic domains, while a heavy line 314 alternately disposed with the dotted line 316 depicts a driving current direction for each layer. The same current pulses are used for the driving current for each layer, but the driving current direction changes alternately. Therefore, the dotted line 316 is coupled from the uppermost layer to the bottommost layer via the coupling structure. Data from the uppermost layer can be moved in sequence to the bottommost layer, and a cycle can be achieved by using the circuit unit 800 to move the data back to the uppermost level. Therefore, the magnetic shift register memory in stack structure according to embodiments does not need a buffer region.

Moreover, "uppermost" and "bottommost" are merely words for facilitating description, therefore limitations should not be placed on the geometrical relationship between the positions of the uppermost layer and the bottommost layer. Additionally, the location of the writing device 310 and reading device 312 are examples in one embodiment. In the same mechanism described in the embodiment, corresponding changes can be applied.

Figure 7:
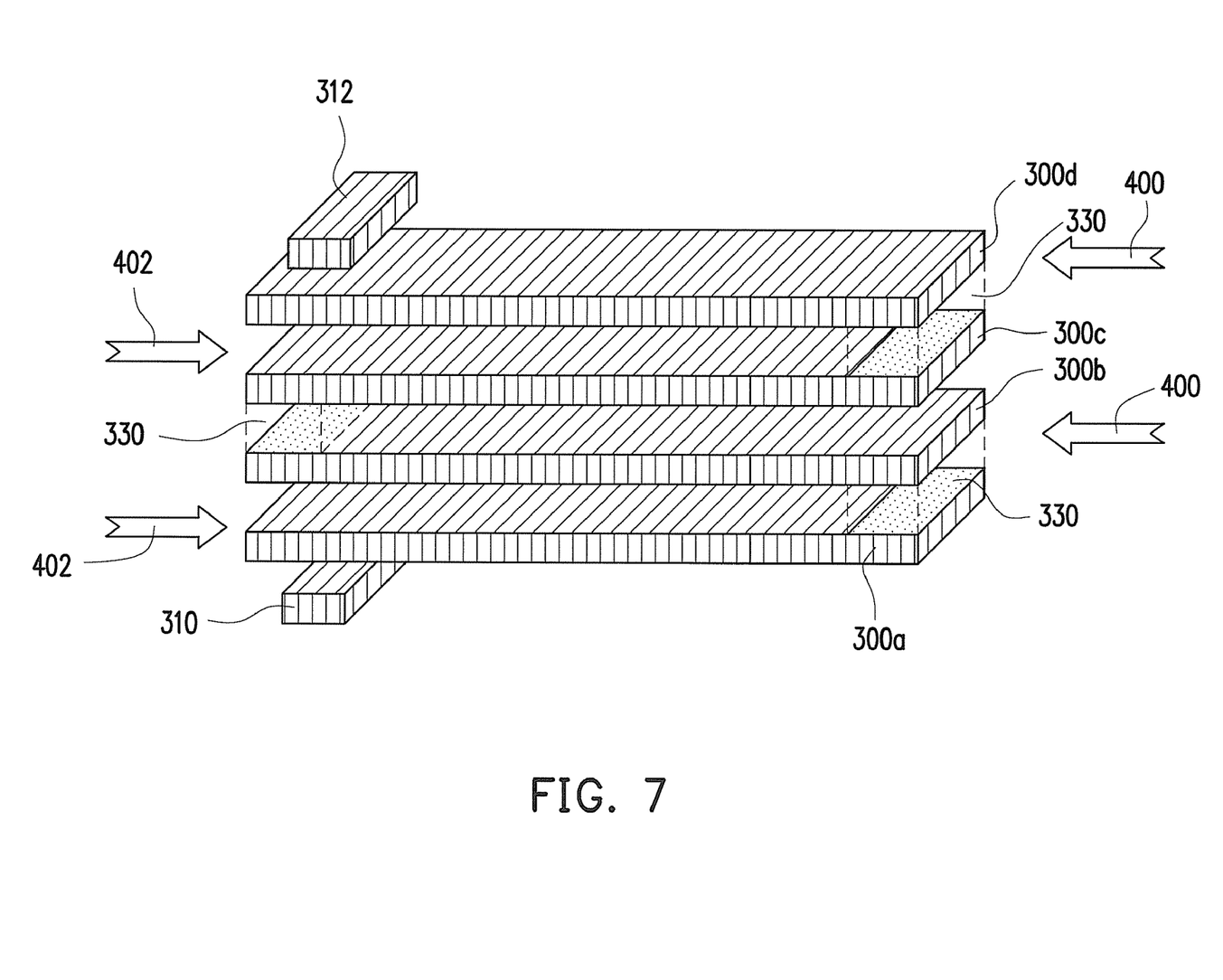
FIG. 7 represents a three-dimensional schematic diagram of FIG. 5.

FIG. 7 represents a three-dimensional schematic diagram of FIG. 5. Referring to FIG. 7, the magnetic shift registering layers are easier to fabricate since they are planar strip layers arranged to stack on each other. The coupling structure between two adjacent layers can be free space or a magnetic coupling material. If data is moving down from up, then the coupling structure allows data from the upper magnetic domain to couple to the lower magnetic domain, thereby an one-way data transmission can be achieved. As shown in arrows 400 and 402, since the design has a mutually stacking structure, the moving direction for two adjacent layers is different and alternately changing.

Figure 8:
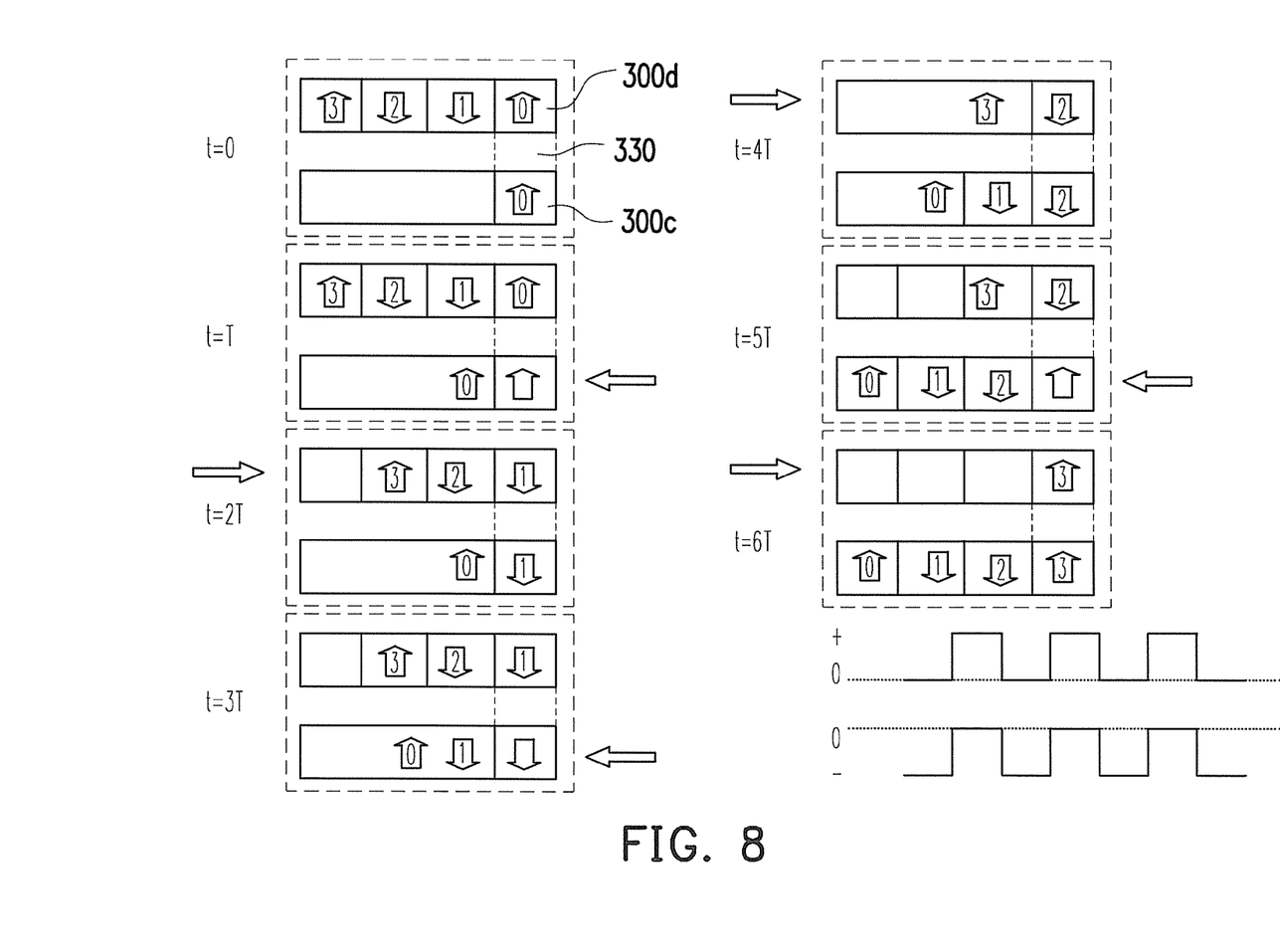
FIG. 8 represents a schematic diagram illustrating a mechanism for data flow in accordance with one embodiment.

FIG. 8 represents a schematic diagram illustrating a mechanism for data flow in accordance with one embodiment. Referring to FIG. 8, in the bottom right-hand corner the driving current pulses represent a rightward and a leftward driving current. Using the motion between two adjacent magnetic shift registering layers 300c and 300d as an example, the coupling structure 330 is disposed in the coupling region at the right end, and each magnetic shift registering layer has four magnetic domains 0-3, for example. The stored data is represented by the magnetization direction. At a t=0 phase, data from the magnetic domain 0 of the magnetic shift registering layer 300d can be successfully transferred to the magnetic shift registering layer 300c, since a fringing field requires the magnetic domain beneath the coupling structure 330 to have the same data as the magnetic domain 0. At t=T, the magnetic shift registering layer 300c moves one magnetic domain to the left, and the magnetic domain beneath the coupling structure is free. At t=2T, the magnetic shift registering layer 300d moves one magnetic domain to the right, and thus the data of magnetic domain 1 is coupled to the magnetic shift registering layer 300c. At t=3T, the magnetic domains of the magnetic shift registering layer 300c move one magnetic domain to the left. At t=4T, the magnetic shift registering layer 300d moves one magnetic domain to the right, and thus the data of magnetic domain 2 is coupled to the magnetic shift registering layer 300c. At t=5T, the magnetic domains of the magnetic shift registering layer 300c move one magnetic domain to the left. At t=6T, the magnetic shift registering layer 300d moves one magnetic domain to the right, and thus the data of magnetic domain 3 is coupled to the magnetic shift registering layer 300c. Accordingly, the magnetic shift registering layer 300d is transferred to the magnetic shift registering layer 300c.

In order to meet operational needs, the magnetic domain corresponding to the writing device on the magnetic shift registering layer 300d can be written with needed data, such as data read by the reading device, or new data to be written.

Figure 9:
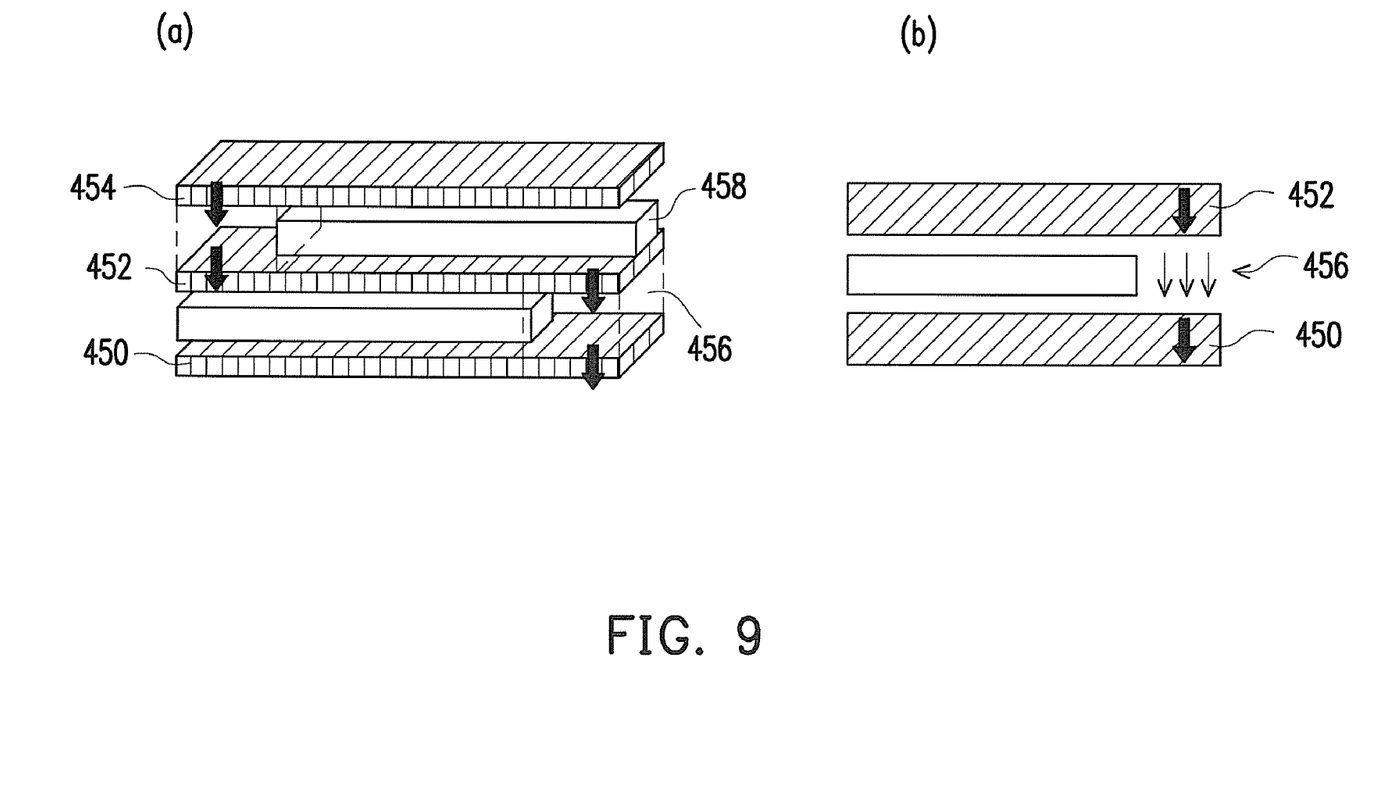
FIG. 9 represents a schematic diagram illustrating the structure of a shielding layer between a plurality of magnetic shift registering layers in accordance with one embodiment.

The shielding layer is described below. FIG. 9 represents a schematic diagram illustrating the structure of a shielding layer between the magnetic shift registering layers in accordance with one embodiment. Referring to FIG. 9(a), for perpendicular materials and particularly when a fringing field is used to write data to magnetic domains of another layer, the shielding layer 458 is disposed between magnetic shift registering layers 450, 452, and 454, and the coupling region 456 is exposed. FIG. 9(b) represents a cross-sectional schematic diagram of FIG. 9(a). The shielding layer 458 can comprise of materials with high permeability for shielding magnetic fields. Therefore, the magnetic domain of the coupling region is affected by the fringing field. Due to the shielding layer 458, the coupling region can comprise of a free space. In the embodiment, the shielding layer 458 has a single layer, although this implementation of the shielding layer 458 is not the only possible implementation thereof.

Figure 10:
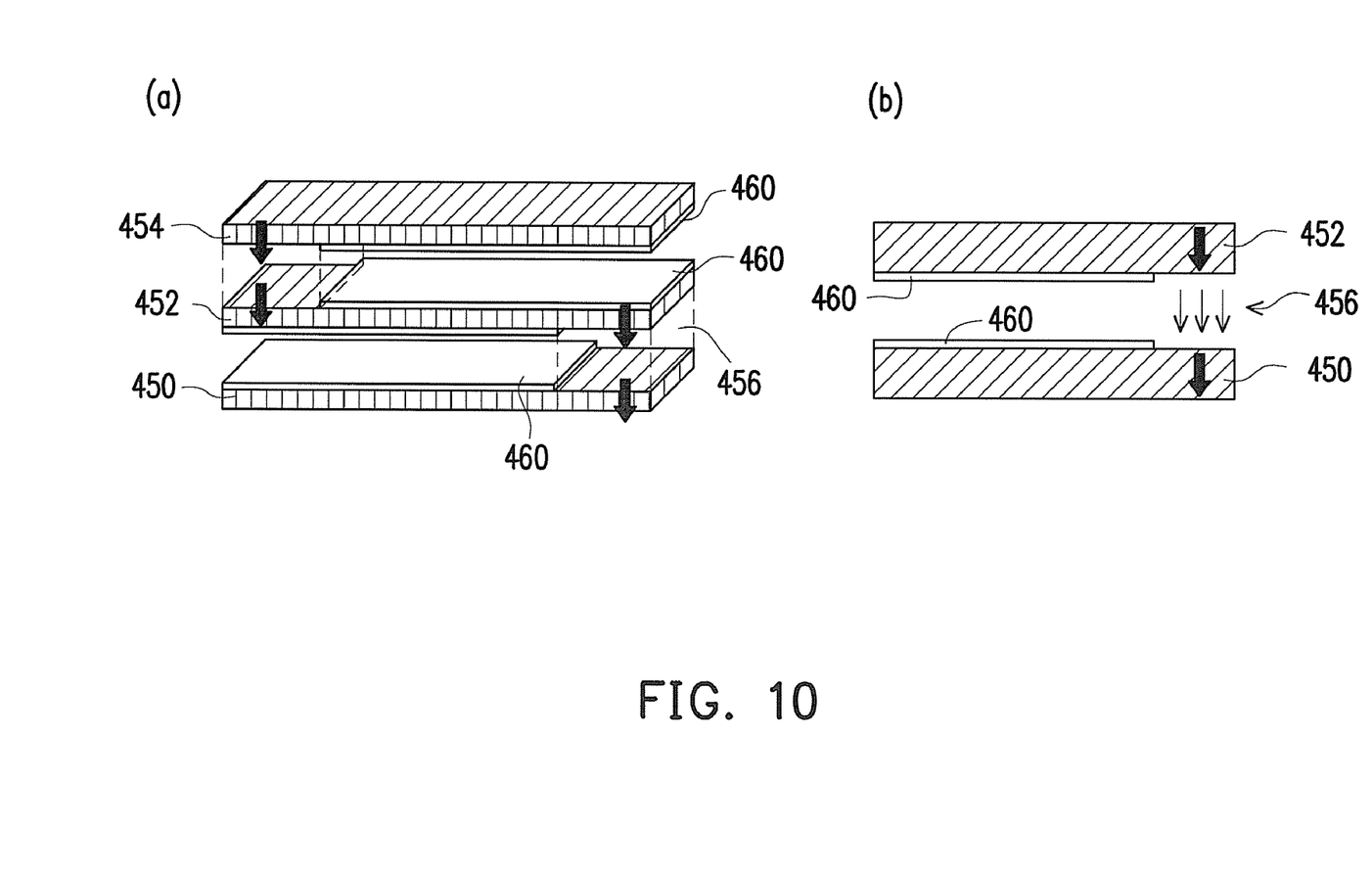
FIG. 10 represents a schematic diagram illustrating the structure of a shielding layer disposed between the magnetic shift registering layers in accordance with one embodiment.

FIG. 10 represents a schematic diagram illustrating the structure of the shielding layer disposed between the magnetic shift registering layers in accordance with one embodiment. Referring to FIG. 10(a), a shielding layer 460 is a thin layer that is disposed on a surface of each of the magnetic shift registering layers 450, 452, and 454. FIG. 10(b) represents a cross-sectional schematic diagram of FIG. 10(a). In other words, the shielding layer 460 can be altered according to design considerations for shielding magnetic interference.

Figure 11:
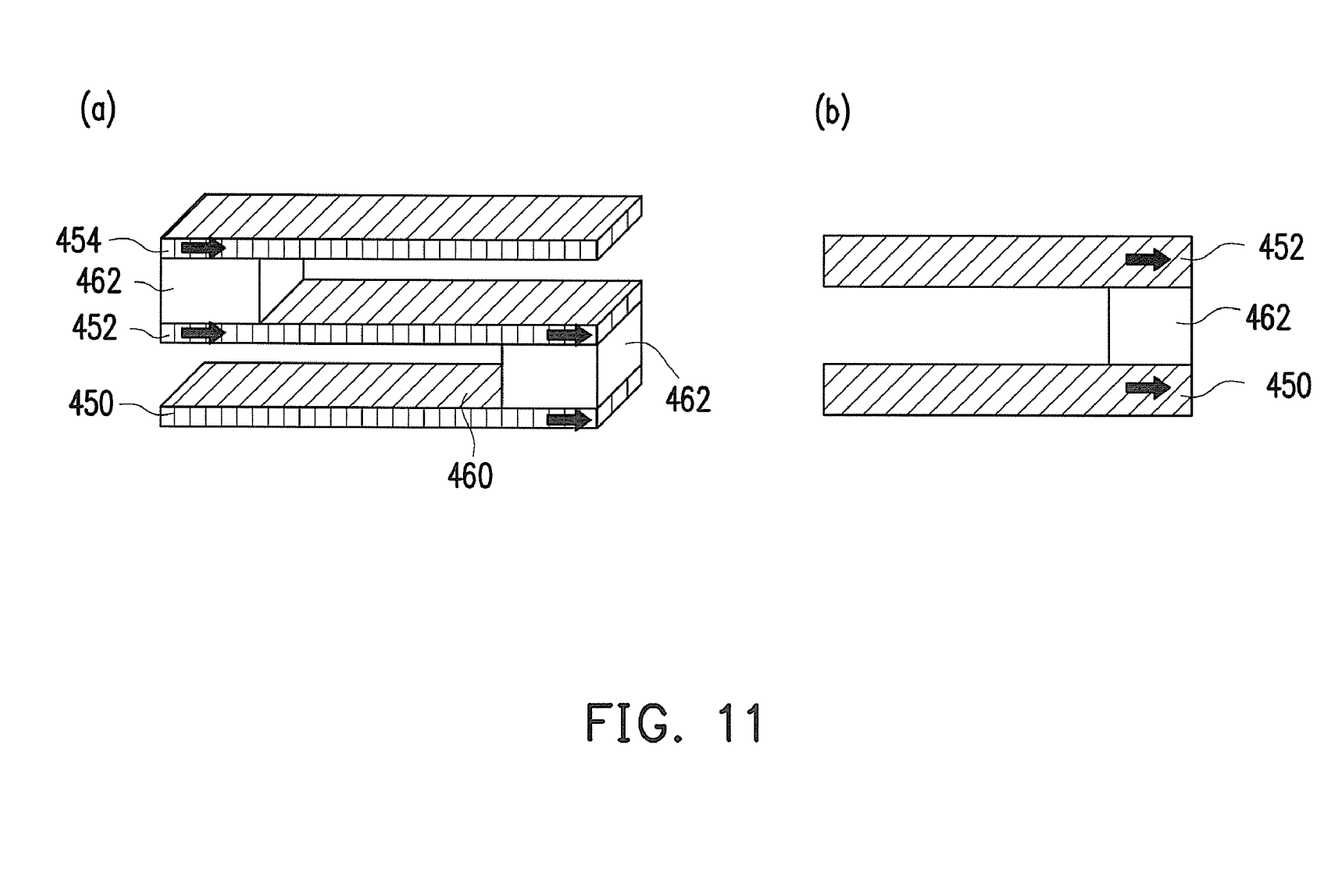
FIG. 11 represents a schematic diagram illustrating the structure of the shielding layer disposed between the magnetic shift registering layers in accordance with one embodiment.

FIG. 11 represents a schematic diagram illustrating the structure of the shielding layer disposed between the magnetic shift registering layers in accordance with one embodiment. Referring to FIG. 11(a), if a design of the magnetic domains call for parallel materials, then the magnetization direction of the magnetic domains is parallel. There is either no fringing field, or the strength of the fringing field is very weak, thereby considerations for the shielding layer depicted in FIGS. 9-10 are not necessary. However, there is no fringing field at the upper magnetic domain of the coupling region for writing to the lower magnetic domain of the next lower layer, thereby a physical coupling structure 462 is needed to couple the magnetic field of the upper magnetic domain to the lower magnetic domain. FIG. 11(b) represents a cross-sectional schematic diagram of FIG. 11(a).

Figure 12:
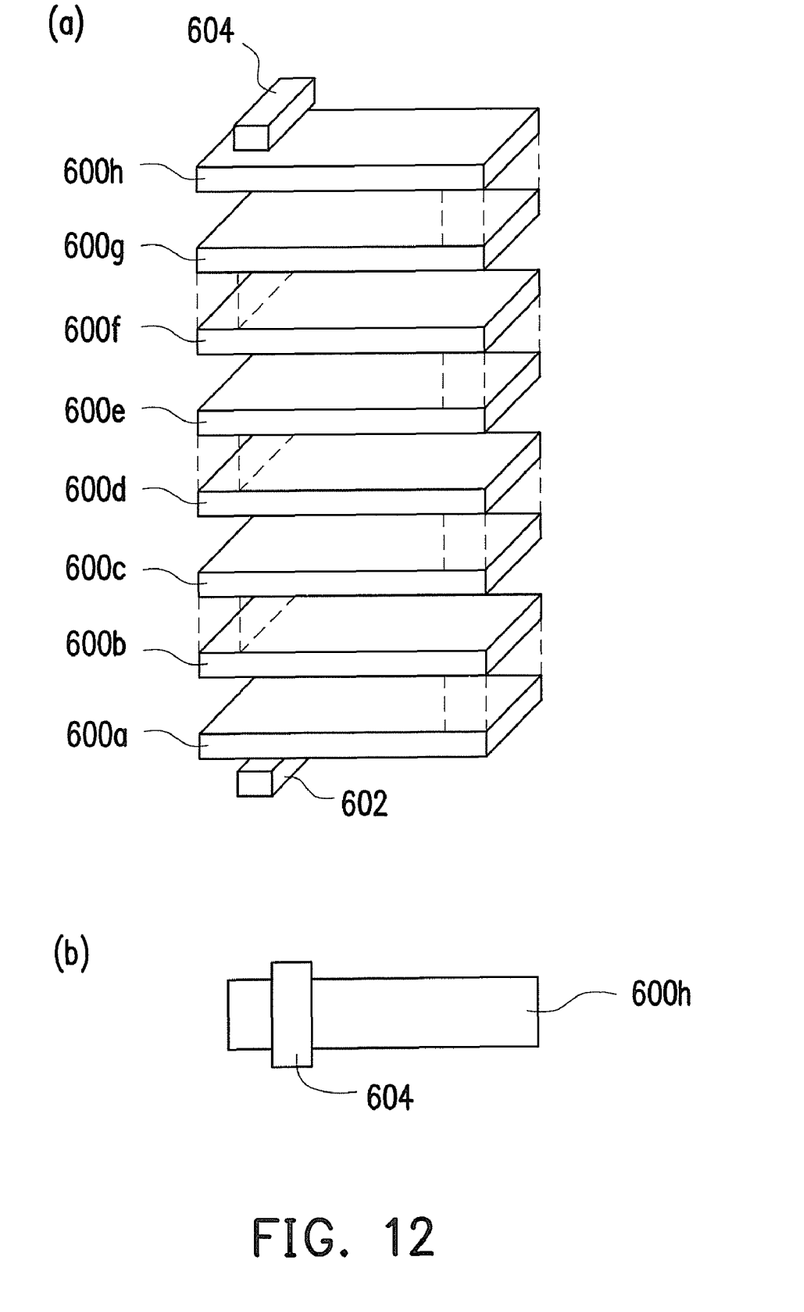
FIG. 12 represents a plurality of schematic diagrams illustrating a three-dimensional view and a top view of the magnetic shift register memory in stack structure in accordance with one embodiment.

FIG. 12 represents a plurality of schematic diagrams illustrating a three-dimensional view and a top view of the magnetic shift register memory in stack structure in accordance with one embodiment. Referring to FIG. 12(a) and using eight layers as an example, the unit of stacking structure comprises eight layers of magnetic shift registering layers 600a-600h arranged to stack on each other. The reading device 602 is disposed at either a foremost magnetic shift registering layer 600h or a last magnetic shift registering layer 600a. For example, the reading device 602 can be disposed at one end of the magnetic shift registering layer 600a. Additionally, the writing device 604 is disposed at either the foremost magnetic shift registering layer 600h or the last magnetic shift registering layer 600a. For example, the writing device 604 can be disposed at one end of the magnetic shift registering layer 600h. This eight layers structure has the same operational mechanism as the four layers structure depicted in FIG. 5. The number of layers is determined by practical needs, and at least two layers are required. Referring to the top view of FIG. 12(b), since the eight layers of the magnetic shift registering layers 600a-600h are arranged in a stacking manner, the magnetic shift registering layer 600h and the writing device 604 can be seen.

Figure 13:
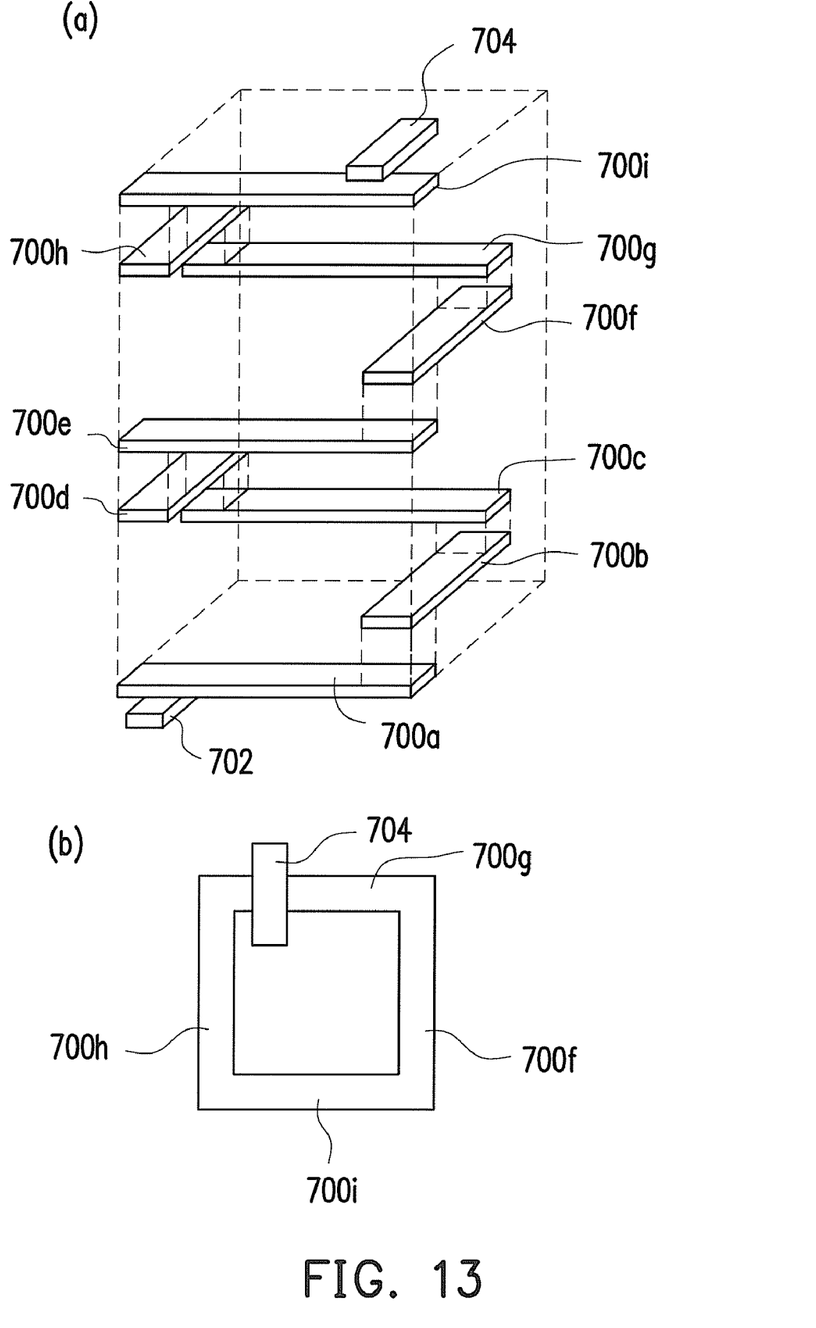
FIG. 13 represents a plurality of schematic diagrams illustrating a three-dimensional view and a top view of the magnetic shift register memory in stack structure in accordance with one embodiment.

FIG. 13 represents a plurality of schematic diagrams illustrating a three-dimensional view and a top view of the magnetic shift register memory in stack structure in accordance with one embodiment. Referring to FIG. 13(a) and using nine layers as an example, the unit of stacking structure comprises nine layers of magnetic shift registering layers 700a-700i arranged to stack on each other in a spiraling manner at the four sides, and the overlapping portion is at the coupling region of the two ends. Therefore, shielding layers are not required for perpendicular materials. A reading device 702 can be disposed at one end of the magnetic shift registering layer 700a. Furthermore, a writing device 704 can be disposed at one end of the magnetic shift registering layer 700i. Referring to FIG. 13(b) which is a top view of FIG. 13(a), the magnetic shift registering layers 700g-700i form a rectangular structure. With this type of structure, the driving current can flow along a spiraling direction, thereby alternating directions of motion is not required.

Figure 14:
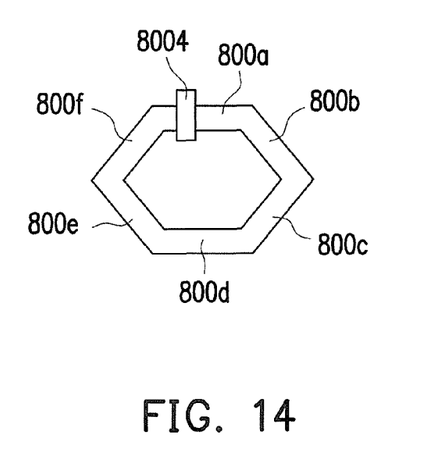
FIG. 14 represents a schematic diagram illustrating a top view of the magnetic shift register memory in stack structure in accordance with one embodiment.

FIG. 14 represents a schematic diagram illustrating a top view of the magnetic shift register memory in stack structure in accordance with one embodiment. Referring to FIG. 14, in a similar manner, other polygonal shapes can be formed. For example, a hexagonal structure comprising magnetic shift registering layers 800*a*-800*f* and having a writing device 8004 disposed at one end of a magnetic shift registering layer 800*a*.

Figure 15:
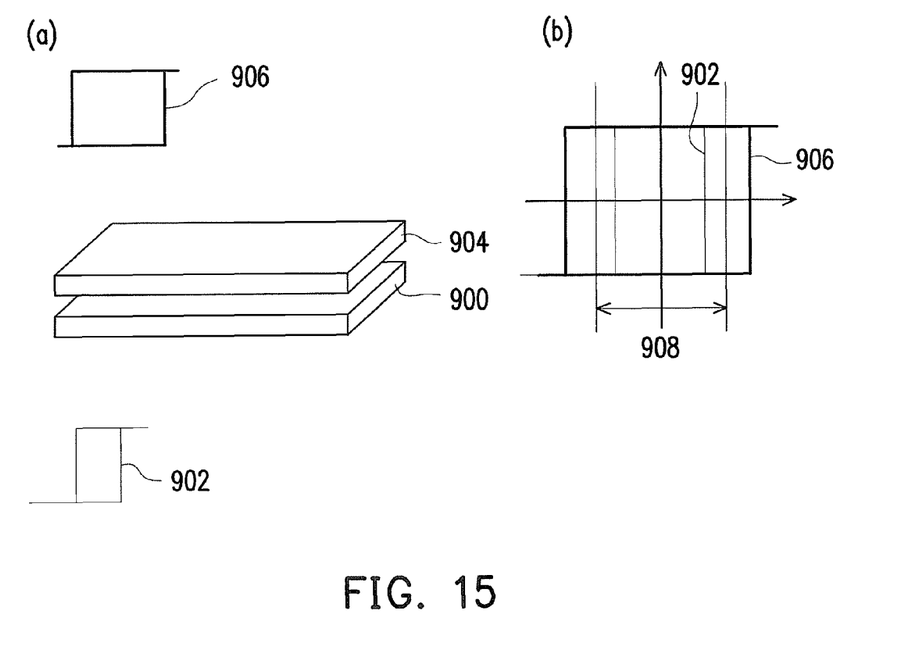
FIG. 15 represents a schematic diagram illustrating a coupling structure using a coercive force mechanism in accordance with one embodiment.

The coupling mechanism for the upper and lower layers at the coupling region is further described below. FIG. 15 represents a schematic diagram illustrating a coupling structure using a coercive force mechanism in accordance with one embodiment. Referring to FIG. 15, this design of the coupling region considers one-way coupling as an example, in which only the magnetic domain at an upper layer can write to the magnetic domain at a lower layer. In this design, a coercive force field 906 of an upper track 904 and a coercive force field 902 of a lower track 900 do not have the same strength. A coupling force 908 is sandwiched between the coercive force fields 902 and 906 whereby the lower magnetic domain is written and the upper magnetic domain remains the same. In other words, this design can transmit data at the upper magnetic domain to the lower magnetic domain, and a data transmission in the reverse direction is like, vice versa. With proper thin film design, the coupling region allowing single direction data transmission as required by the embodiment can be achieved. Regional magnetic coercive forces can be altered in a plurality of techniques, such as (1) changing the regional geometrical relationships; (2) doping materials having regional magnetic characteristics such as Au, Ag, or Cu; and (3) stacking adjacent magnetic layers to change the regional magnetic characteristics.

Embodiments provide a magnetic shift register memory in stack structure, in which the magnetic shift registering layers can be planar strip layers, and adjacent registering layers transmit data across layers using a coupling mechanism to completely transfer a stored data.

Although the invention has been disclosed by the above embodiments, they are not intended to limit the embodiment. Anybody skilled in the art may make some modifications and alterations without departing from the spirit and scope of the embodiment. Therefore, the protection range of the embodiment falls in the appended claims.

What is claimed is:

1. A magnetic shift register memory arranged in a stack structure, comprising:
    a plurality of magnetic shift registering layers for forming an unit of stack structure, wherein each of the magnetic shift registering layers comprises a plurality of magnetic domains, each of the magnetic domains has a magnetization direction corresponding to a stored data, adjacent two of the magnetic shift registering layers respectively have an upper magnetic domain and a lower magnetic domain forming a coupling region with a coupling structure, and the coupling structure is implemented to allow a fringing field from the upper magnetic domain to induce the lower magnetic domain so that the lower magnetic domain and the upper magnetic domain have the same stored data, wherein the magnetic shift registering layers are divided into a first group and a second group, wherein the magnetic shift registering layers of the first group are interlaced with the magnetic shift registering layers of the second group; and
    a driving current unit coupled to the magnetic shift registering layers for respectively providing a first driving current having a first direction on the first group and a second driving current having a second direction opposite to the first direction on the second group, wherein each of the magnetic shift registering layers has a current input end and a grounded end, and the first driving current or the second driving current just flows in each corresponding one of the magnetic shift registering layers, so that the stored data in the magnetic domains of the magnetic shift registering layers is moved in a flow direction, wherein the stored data at the upper magnetic domain is passed to the lower magnetic domain.

2. The magnetic shift register memory as claimed in claim 1, further comprising:
    a writing device disposed in either the foremost registering layer or the last registering layer for writing a written data into one of the magnetic domains passing before the writing device; and
    a reading device disposed in either the foremost registering layer or the last registering layer for reading a read data from one of the magnetic domains passing before the reading device.

3. The magnetic shift register memory as claimed in claim 2, further comprising a circuit unit for transmitting the read data to the writing device, serving as the written data for a repeated writing into the magnetic domain passing through the writing device.

4. The magnetic shift register memory as claimed in claim 2, wherein the written data is a new data to be written.

5. The magnetic shift register memory as claimed in claim 1, wherein the unit of stack structure comprises the magnetic shift registering layers arranged to fully stack on each other, and the driving current unit provides different electron flow directions to at least one even-numbered registering layer of the first group and at least one odd-numbered registering layer of the second group.

6. The magnetic shift register memory as claimed in claim 5, wherein a shielding layer is disposed between the two adjacent magnetic shift registering layers, and the coupling structure is a free space or a magnetic coupling body.

7. The magnetic shift register memory as claimed in claim 5, wherein no shielding layer is disposed between the two adjacent magnetic shift registering layers, and the coupling structure disposed in the coupling region is a magnetic coupling body.

8. The magnetic shift register memory as claimed in claim 1, wherein each of the magnetic shift registering layers has a same coercive force.

9. The magnetic shift register memory as claimed in claim 1, wherein two of the magnetic shift registering layers respectively disposed above and beneath the coupling region has two different coercive forces, and a coupling force of the coupling region is sandwiched between the two coercive forces.

10. The magnetic shift register memory as claimed in claim 1, wherein the unit of stack structure has the magnetic shift registering layers stacking only at the coupling region, and the electron flow direction provided to each of the magnetic shift registering layers flows from an end of the coupling region to an other end of the coupling region.

11. The magnetic shift register memory as claimed in claim 1, wherein the magnetic shift registering layers have a rectangular structure.

12. The magnetic shift register memory as claimed in claim 1, wherein the magnetic shift registering layers have a polygonal structure.

13. The magnetic shift register memory as claimed in claim 1, wherein the magnetization direction for each of the magnetic domains is parallel to the magnetic shift registering layers.

14. The magnetic shift register memory as claimed in claim 13, wherein the coupling structure of the coupling region comprises a magnetic exchange material.

15. The magnetic shift register memory as claimed in claim 1, wherein the magnetization direction for each of the magnetic domains is perpendicular to the magnetic shift registering layers.

16. The magnetic shift register memory as claimed in claim 15, wherein the coupling structure of the coupling region comprises a free space, and the coupling structure is implemented to use a fringing field for coupling.

17. The magnetic shift register memory as claimed in claim 1, wherein each of the magnetic shift registering layers has a first terminal for receiving the first driving current or the second driving current depending on belonging of the first group or the second group, and a second terminal for receiving a ground voltage.

18. The magnetic shift register memory as claimed in claim 17, wherein the second terminal of each of the magnetic shift registering layers is a sharp protrusion structure and is coupled to the ground voltage.

19. The magnetic shift register memory as claimed in claim 1, wherein the coupling structure is not used to store data.

* * * * *